(12) United States Patent
Sen et al.

(10) Patent No.: US 9,548,705 B2
(45) Date of Patent: Jan. 17, 2017

(54) AMPLIFIER HAVING ORTHOGONAL TUNING ELEMENTS

(71) Applicants: Shreyas Sen, Altana, GA (US); Abhijit Chatterjee, Marietta, GA (US)

(72) Inventors: Shreyas Sen, Altana, GA (US); Abhijit Chatterjee, Marietta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 904 days.

(21) Appl. No.: 13/831,192

(22) Filed: Mar. 14, 2013

(65) Prior Publication Data

US 2016/0099683 A1   Apr. 7, 2016

Related U.S. Application Data

(60) Provisional application No. 61/610,673, filed on Mar. 14, 2012.

(51) Int. Cl.
  *H03F 1/02*   (2006.01)
  *H03F 3/193*  (2006.01)
  *H03F 1/32*   (2006.01)

(52) U.S. Cl.
  CPC ............ *H03F 3/193* (2013.01); *H03F 1/0261* (2013.01); *H03F 1/3205* (2013.01); *H03F 2200/294* (2013.01); *H03F 2200/451* (2013.01)

(58) Field of Classification Search
  CPC ........ H03F 3/04; H03F 2200/18; H03F 1/301; H03F 1/302; H03F 3/19; H03F 2203/45051; H03F 2200/54; H03F 2200/451; H03B 5/1221

USPC ................................. 330/296, 285, 277, 310
  See application file for complete search history.

(56) References Cited

U.S. PATENT DOCUMENTS

| | | | |
|---|---|---|---|
| 7,432,767 B2 | 10/2008 | Kasperkovitz | |
| 7,715,813 B2 | 5/2010 | Heng | |
| 8,487,695 B2* | 7/2013 | Soe | H03F 3/301 327/562 |
| 8,711,047 B2 | 4/2014 | Tran | |
| 8,744,386 B2 | 6/2014 | Heng | |
| 2010/0323651 A1 | 12/2010 | Ranjan | |

OTHER PUBLICATIONS

Sen, S.; Natarajan, V.; Senguttuvan, R.; Chatterjee, A.; , "Pro-Vizor: Process tunable virtually zero margin low power adaptive RF for wireless systems," Design Automation Conference, 2008. DAC 2008. 45th ACM/IEEE , vol. No. pp. 492-497, Jun. 8-13, 2008.

(Continued)

*Primary Examiner* — Hieu Nguyen
(74) *Attorney, Agent, or Firm* — Troutman Sanders LLP; Ryan A. Schneider

(57) ABSTRACT

An amplifier having orthogonal tuning elements is provided. In one embodiment, an amplifier comprises an input amplifier stage having a first tuning element used to control a first performance criteria of the amplifier; an output amplifier stage operatively coupled to the first amplifier stage; a bias circuit operatively coupled to the second amplifier stage and having a second tuning element used to control a second performance criteria of the amplifier; and wherein the first tuning element operates substantially independent of the second tuning element.

18 Claims, 10 Drawing Sheets

(56) References Cited

OTHER PUBLICATIONS

Senguttuvan, R.; Sen, S.; Chatterjee, A.; , "Multidimensional Adaptive Power Management for Low-Power Operation of Wireless Devices," IEEE TCAS II , vol. 55, No. 9, pp. 867-871, Sep. 2008.
H Weissman, A Brillant, S Sengupta, "Method and Apparatus for Providing Jammer Detection in a Receiver"—WO Patent WO/2010/014,803, 2010.
Sen, S.; Senguttuvan, R.; Chatterjee, A.; , "Environment-Adaptive Concurrent Companding and Bias Control for Efficient Power-Amplifier Operation," IEEE Transactions on Circuits and Systems I: Regular Papers, (to appear).
Chatterjee, A.; et. al., "Iterative built-in testing and tuning of mixed-signal/RF systems," IEEE ICCD 2009.
Natarajan, V.; Sen, S.; Devarakond, S.K.; Chatterjee, A.; , "A holistic approach to accurate tuning of RF systems for large and small multiparameter perturbations," VLSI Test Symposium (VTS), 2010 28th , vol. No. pp. 331-336, Apr. 19-22, 2010.
Zhan, J.-H.C.; Carlton, B.R.; Taylor, S.S.; , "A Broadband Low-Cost Direct-Conversion Receiver Front-End in 90 nm CMOS," Solid-State Circuits, IEEE Journal of , vol. 43, No. 5, pp. 1132-1137, May 2008.
Kim, C.-W.; Jung, M.-S.; Lee, S.-G.; , "Ultra-wideband CMOS low noise amplifier," Electronics Letters , vol. 41, No. 7, pp. 384-385, Mar. 31, 2005.
Bruccoleri, F.; Klumperink, E.A.M.; Nauta, B.; , "Wide-band CMOS low-noise amplifier exploiting thermal noise canceling," Solid-State Circuits, IEEE Journal of , vol. 39, No. 2, pp. 275-282, Feb. 2004.
Qiang Li; Yue Ping Zhang; , "A 1.5-V 2-9.6-GHz Inductorless Low-Noise Amplifier in 0.13-um CMOS,", IEEE T-MTT, vol. 55, No. 10, pp. 2015-2023, Oct. 2007.
Kim, Chang-Wan; Min-Suk Kang; Phan Tuan Anh; Hoon-Tae Kim; Sang-Gug Lee; , "An ultra-wideband CMOS low noise amplifier for 3-5-GHz UWB system," Solid-State Circuits, IEEE Journal of , vol. 40, No. 2, pp. 544-547, Feb. 2005.

* cited by examiner

| | This work* | [20] | [23] | [24] |
|---|---|---|---|---|
| Technology | 0.18μ | 0.25μ | 0.13μ | 0.18μ |
| S21 (dB) | 15.3 | 13.7 | 11 | 9.8 |
| NF (dB) | 1.88 | 2 | 3.6 | 2.3 |
| S11 (dB) | -12.8 | -12 | -5.3 | -9 |
| S22 (dB) | -7.84 | -12 | - | - |
| Id/Vdd (mA/V) | 12.6/1.8 | 14/2.5 | 19/1.5 | 7/1.8 (w/o buffer) |
| OIP3 (dBm) | -1 | 13.7 | 3.8 | -7 |
| BW (Hz) | 70M-1.5G | 2M-1.6G | 2G-9.6G | 2-4.6G |

AMPLIFIER HAVING ORTHOGONAL TUNING ELEMENTS

CROSS REFERENCE TO RELATED APPLICATIONS

This application claims the priority benefit of U.S. Provisional Applications Ser. No. 61/610,673, filed on Mar. 14, 2012, titled "Orthogonal Tuneability in RF LNA for Robust Low Power Adaptive Wireless Systems," the contents of which are hereby incorporated by reference as if fully set forth below.

STATEMENT OF GOVERNMENT SUPPORT

This invention was made with Government support under Agreement No. HR0011-10-3-0002, awarded by DARPA. The Government has certain rights in the invention.

FIELD OF USE

The present disclosure relates generally to electronics, and more specifically, to amplifiers having orthogonal tuning elements.

BACKGROUND

The popularity of battery-operated portable electronics with wireless connectivity has driven the design of radio frequency (RF) analog circuitry to consume less power while maintaining or increasing performance. The fabrication of these complex circuits using complementary metal oxide semiconductor (CMOS) fabrication processes increases variability over voltage, temperature, age and the like, resulting in lower yields. The requirement for low power and high yield is difficult to achieve using traditional static circuit design techniques. Thus, there is a need for adaptive or reconfigurable wireless systems that use underlying tunable RF, analog or mixed-signal elements. By using a tunable element such as a tuning circuit, a wireless system is more capable of improving power consumption and performance considering variables such as environment, process or performance requirements. Such adaptability is enabled using tuning elements in circuits to allow a trade-offs between various criteria such as power consumption and performance. However, a tuning element used in a traditional RF circuit design typically impacts multiple performance criteria, making it more difficult to adjust a tuning element for a particular criteria. Further, traditional circuit designs may lack sufficient tuning elements to achieve independent or orthogonal control of any particular criteria.

Furthermore, traditional wireless circuits and systems are typically overdesigned to allow operation in various environments, which impact wireless channel conditions by adding delay spread, fading, co-channel and adjacent channel interferers/blockers and the like. RF systems are typically designed to adapt to such environments by trading-off the performance of the RF receiver's front-end circuits to reduce power consumption during stronger channel conditions. For example, when the received signal strength is moderate and there is no co-channel or adjacent channel interference/blockers, the linearity of the low-noise amplifier (LNA) may result in the LNA consuming more power than needed.

In addition, increased semiconductor process variations may lead to loss of yield as components fail one or more performance criteria. Further, RF circuits and systems typically exhibit lower yields than digital circuits and systems due to the interdependence and complex nature of multiple performance criteria and the inability to adequately adjust for such performance criteria. Accordingly, there is a need for techniques to independently or orthogonally tune various performance criteria of amplifiers. Furthermore, other desirable features and characteristics of the present disclosure will become apparent from the subsequent detailed description and claims, taken in conjunction with the accompanying figures and the foregoing technical field and background.

SUMMARY OF THE DISCLOSURE

The subject innovation relates to an amplifier having orthogonal tuning elements. In one embodiment, an amplifier may be configured to include an input amplifier stage having a first tuning element used to control a first performance criteria of the amplifier. Further, the amplifier may be configured to include an output amplifier stage that is operatively coupled to the first amplifier stage. Also, the amplifier may be configured to include a bias circuit operatively coupled to the second amplifier stage and having a second tuning element used to control a second performance criteria of the amplifier. Finally, the first tuning element may operate substantially independent of the second tuning element.

BRIEF DESCRIPTION OF THE FIGURES

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, where.

DETAILED DESCRIPTION

Figure 1:
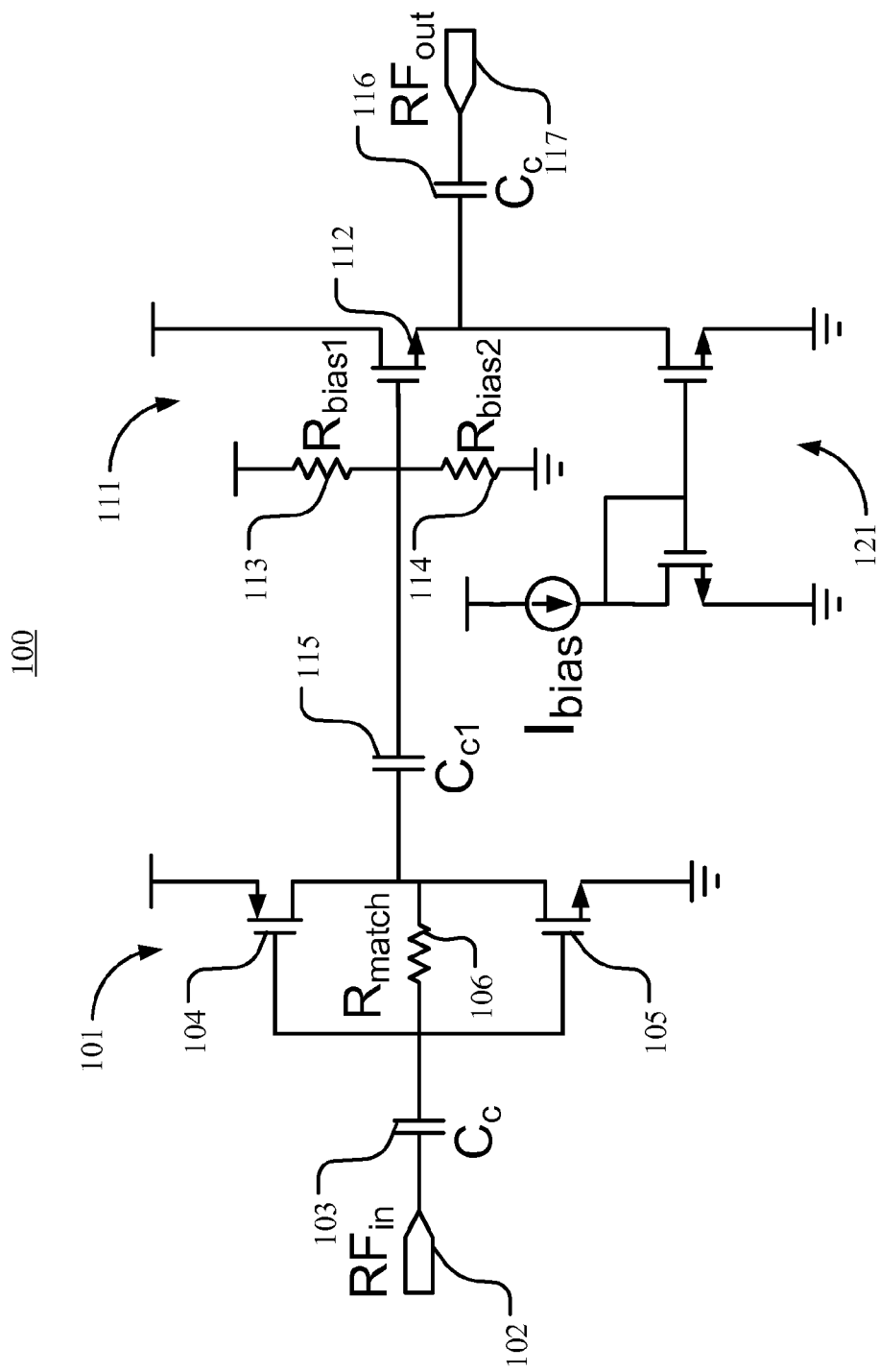
FIG. 1 is a schematic diagram illustrating one embodiment of an amplifier in accordance with various aspects set forth herein.

This disclosure provides example methods, devices or systems for the design of an amplifier having orthogonal tuning elements to control various aspects of performance. In one example, an amplifier may be configured to include a first tuning element and a second tuning element. The first tuning element may be used to adjust the gain of the amplifier without substantially affecting the linearity of the amplifier. Similarly, the second tuning element may be used to adjust the linearity of the amplifier without substantially affecting the gain of the amplifier. Thus, the first tuning element operates substantially independent or orthogonal of the second tuning element. To begin with, FIG. 1 is a schematic diagram illustrating one embodiment of an amplifier 100 in accordance with various aspects set forth herein. The amplifier 100 may be configured to include an input amplifier stage 101, an output amplifier stage 111 and a bias circuit 121. In one example, the amplifier 100 may be an inductorless low-noise amplifier (LNA). The input amplifier stage 101, which may also be referred to as an input stage, may be configured to provide an input matching impedance such as fifty ohms (50Ω) and a high voltage gain. The output amplifier stage 111 may be configured to provide a high current drive capability into a low load impedance such as fifty ohms (50Ω). Further, the output amplifier stage 111 may be optimized differently such as for an LNA driving a mixer with higher input impedance. The bias circuit 121 such as a current mirror may be configured to provide a bias current to the output amplifier stage 111.

In FIG. 1, the input amplifier stage 101 may be configured to include a transistor 104 and a transistor 105 with their drain nodes coupled together. In one example, the transistor 104 may be a P-channel metal oxide semiconductor (PMOS) and the transistor 105 may be an N-channel metal oxide semiconductor (NMOS). A person of ordinary skill in the art will recognize that other types of transistors or combinations may be used. Such a configuration may provide a high voltage gain for the input amplifier stage 101 while driving a high impedance of the output amplifier stage 111. Further, such configuration may also provide a broadband input impedance match such as fifty ohm (50Ω) using a negative feedback through a match resistor ($R_{match}$) 106.

Scattering parameters, which may also be referred to as S-parameters, are the elements of a scattering matrix or S-matrix and are used to describe the electrical behavior of linear electrical circuits. The scattering parameter $S_{11}$ is the input port voltage reflection coefficient. The scattering parameter $S_{12}$ is the reverse voltage gain. The scattering parameter $S_{21}$ is the forward voltage gain. The scattering parameter $S_{22}$ is the output port voltage reflection coefficient. A person of ordinary skill in the art will recognize the use and application of scattering parameters as well as other parameters used to describe or measure the electrical behavior of circuits.

In FIG. 1, a resistance value of the match resistor ($R_{match}$) 106 may be configured to increase a forward voltage gain ($S_{21}$), decrease a noise figure (NF) or decrease an input port voltage reflection coefficient ($S_{11}$), which may also be referred to as an input return loss. The input amplifier stage 101 may be self-biased via the transistor 104, the transistor 105, or the match resistor ($R_{match}$) 106. The high voltage gain provided by the input amplifier stage 101 may be converted to a power gain by the output amplifier stage 111, which may also be referred to as a source follower output stage. The input node ($RF_{in}$) 102 may be used to input an electrical signal to the amplifier 100. Further, the input node ($RF_{in}$) 102 may be alternating current (AC) coupled to the input amplifier stage 101 using a first capacitor ($C_c$) 103.

In the current embodiment, the output amplifier stage 111 may be configured to include a transistor 112, which may also be referred to as a common drain NMOS transistor, biased using a first bias resistor ($R_{bias1}$) 113 and a second bias resistor ($R_{bias2}$) 114, each of which may also be referred to as a high biasing resistor. The output of the input amplifier stage 101 may be AC coupled to the input of the output amplifier stage 111 using a second capacitor ($C_{c1}$) 115. The output of the output amplifier stage 111 may be AC coupled to the output node ($RF_{out}$) 117 using a third capacitor ($C_c$) 116. The output amplifier stage 111 may be biased using a biasing circuit 121. In one example, the biasing circuit 121 may be a current mirror. In another example, the biasing circuit 121 may be designed to achieve a certain output third-order intercept point (OIP3) performance. In another example, the biasing circuit 121 may be configured for low power consumption. In another example, the biasing circuit 121 may be configured to optimize the OIP3 performance while consuming low power. A person of ordinary skill in the art will recognize many different configurations, designs and techniques for providing a bias current or voltage.

Figure 2:
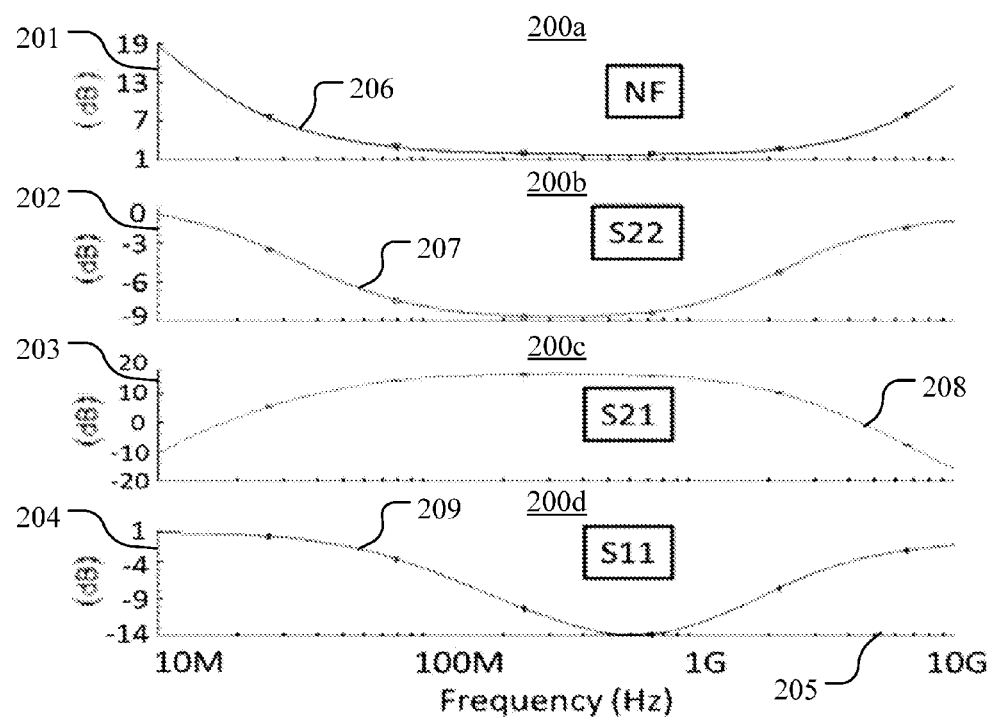
FIG. 2 illustrates a noise figure (NF) plot, an output port voltage reflection coefficient ($S_{22}$) plot, a forward voltage gain ($S_{21}$) plot and an input port voltage reflection coefficient ($S_{11}$) plot of one embodiment of the amplifier of FIG. 1.

FIG. 2 illustrates a noise figure (NF) plot 200a, an output port voltage reflection coefficient ($S_{22}$) plot 200b, a forward voltage gain ($S_{21}$) plot 200c and an input port voltage reflection coefficient ($S_{11}$) plot 200d of one embodiment of the amplifier 100 of FIG. 1. The one embodiment of the amplifier 100 of FIG. 1 is designed using a 0.18μ process for one and one-tenth volts (1.8 Volts) of supply voltage. The noise figure (NF) plot 200a includes a noise figure (NF) graph 206 plotted on an ordinate 201 from one decibel (1 dB) to nineteen decibels (19 dB). The output port voltage reflection coefficient ($S_{22}$) plot 200b includes the output port voltage reflection coefficient ($S_{22}$) graph 207 plotted on an ordinate 202 from minus nine decibels (−9 dB) to zero decibels (0 dB). The forward voltage gain ($S_{21}$) plot 200c includes the forward voltage gain ($S_{21}$) graph 208 plotted on an ordinate 203 from minus twenty decibels (−20 dB) to twenty decibels (20 dB). The input port voltage reflection coefficient ($S_{11}$) plot 200d includes the input port voltage reflection coefficient ($S_{11}$) graph 209 plotted on an ordinate 204 from minus fourteen decibels (−14 dB) to one decibel (1 dB). For each plot 200a to 200d, the frequency response from ten megahertz (10 MHz) to ten gigahertz (10 GHz) is plotted on an abscissa 205.

In FIG. 2, the one embodiment of the amplifier 100 of FIG. 1 has a three decibels (3 dB) bandwidth extending from about seventy megahertz (70 MHz) to one and five-tenths gigahertz (1.5 GHz). At one gigahertz (1 GHz), the one embodiment of the amplifier 100 of FIG. 1 is measured to have about a fifteen and three-tenths decibels (15.3 dB) power gain, about a minus twelve and eight-tenths decibels (−12.8 dB) input port voltage reflection coefficient ($S_{11}$), and about a one and eighty-eight hundredths decibels (1.88 dB) noise figure (NF). Further, the one embodiment of the amplifier 100 of FIG. 1 was measured to consume about twelve and six-tenths milliamps (12.6 mA) of current, of which about nine milliamps (9 mA) of current is consumed in the input amplifier stage 101 of the amplifier 100 since it provides about fifty ohms (50Ω) of wideband input impedance matching and high voltage gain to reduce the noise figure (NF). Further, such measured current consumption includes the output amplifier stage 111 of the amplifier 100.

Figure 3:
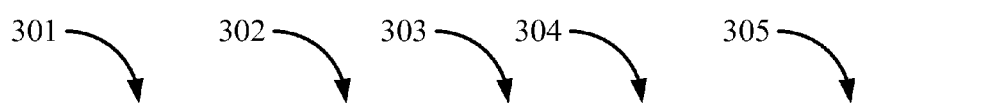
FIG. 3 provides a table comparing the performance of one embodiment of the amplifier of FIG. 1 to other state-of-the-art amplifiers.

FIG. 3 provides a table 300 comparing the performance of one embodiment of the amplifier 100 of FIG. 1 to other amplifiers. A first column 301 provides various performance measures of amplifiers. A second column 302 provides results of the various performance measures, as described in the first column 301, for the one embodiment of the amplifier 100 of FIG. 1. A third column 303 provides results of the various performance measures for the amplifier design described in Zhan, J.-H. C.; Carlton, B. R.; Taylor, S. S.; "A Broadband Low-Cost Direct-Conversion Receiver Front-End in 90 nm CMOS, Solid State Circuits, IEEE Journal of, vol. 33, no. 5, pp. 1132-1137, May 2008." A fourth column 304 provides results of the various performance measures for the amplifier design described in Qiang Li; Vue Ping Zhang; "A 1.5-V 2-9.6-GHz Inductorless Low-Noise Amplifier in 0.13-μm CMOS," IEEE T-MTT, vol. 55, no. 10, pp. 2015-2023, October 2007. Finally, a fifth column 305 provides results of the various performance measures for the amplifier design described in Chang-Wan Kim; Min-Suk Kang; Phan Tuan Anh; Hoon-Tae Kim; Sang-Gug Lee; "An ultra-wideband CMOS low noise amplifier for 3-5-GHz UWB system," Solid-State Circuits, IEEE Journal of, vol. 30, no. 2, pp. 544-547, February 2005. The table 300 shows that the one embodiment of the amplifier of FIG. 1 is comparable in OIP3 performance to the other amplifiers. Further, the one embodiment of the amplifier of FIG. 1 has better performance than the other amplifiers in terms of the forward voltage gain ($S_{21}$) and the noise figure (NF).

Some of the performance criteria of an amplifier such as an LNA are the forward voltage gain ($S_{21}$), the noise figure (NF), the OIP3 and the input port voltage reflection coefficient ($S_{11}$). In one example, a moderate input signal strength with strong interferers present may require a highly linear receiver with a high OIP3 and may allow the forward voltage gain ($S_{21}$) and noise figure (NF) to be more relaxed. In another example, a higher forward voltage gain ($S_{21}$) and a lower noise figure (NF) may be required for a weaker input signal and may provide higher sensitivity. In another example, a higher input signal strength may require a lower forward voltage gain ($S_{21}$) and a higher noise figure (NF). Hence, the forward voltage gain ($S_{21}$) and the noise figure (NF) may be correlated.

Figure 4:
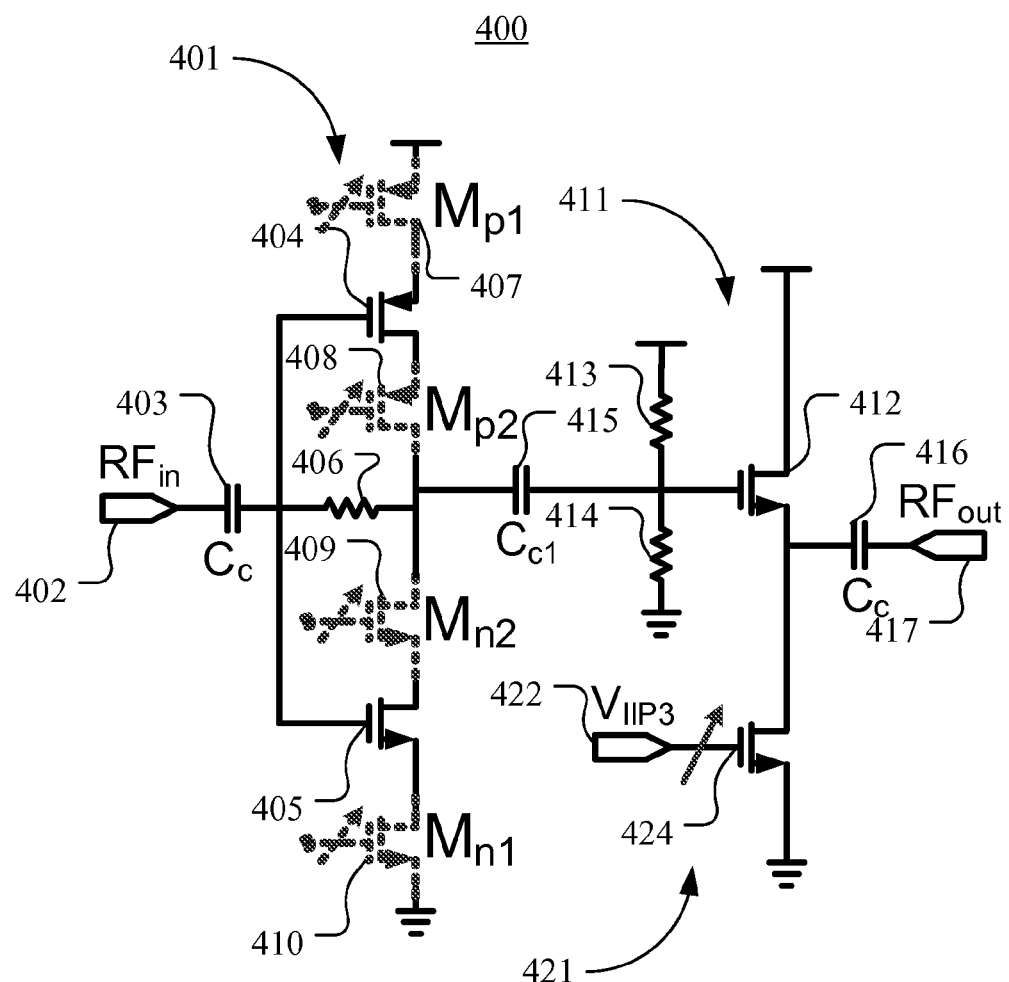
FIG. 4 is a schematic diagram illustrating one embodiment of an amplifier having an orthogonal tuning element with various aspects described herein.

The amplifier 100 of FIG. 1 may be configured to allow for modifying OIP3 performance. The OIP3 performance may be adjusted for power consumption of the amplifier 100 by reducing its supply voltage. However, since the efficiency of a power management unit associated with the amplifier 100 may decrease with reduced supply voltage, the power consumption savings of the amplifier 100 may be minimal. Further, the reduced supply voltage of the amplifier 100 may also degrade the forward voltage gain ($S_{21}$), which may make the adaptation non-orthogonal. Since the OIP3 of the amplifier 100 may be dominated by its output amplifier stage 111, the linearity of the amplifier 100 may not compress the signal levels as long as the signal levels are sufficiently low enough in its input amplifier stage 101. It is important to recognize that the power required in the input amplifier stage 201 of the amplifier 100 to achieve a reasonable forward voltage gain ($S_{21}$) or a noise figure (NF) may provide sufficient OIP3 for the output amplifier stage 111 of the amplifier 100. Thus, the desired OIP3 of the amplifier 100 may be achieved by controlling the tail current of the output amplifier stage 111 of the amplifier 100 by applying an input third-order intercept point (IIP3) controllable voltage bias ($V_{IIP3}$). For example, FIG. 4 is a schematic diagram illustrating one embodiment of an amplifier 400 having orthogonal tuning elements with various aspects described herein. The amplifier 400 may be configured to include an input amplifier stage 401, an output amplifier stage 411 and a bias circuit 421. In one example, the amplifier 400 may be an inductorless RF LNA. The input amplifier stage 401, which may also be referred to as an input stage, may be configured to provide an input matching impedance such as fifty ohms (50Ω) and a high voltage gain. The output amplifier stage 411 may be configured to provide a high current drive capability into a low load impedance such as fifty ohms (50Ω). Further, the output amplifier stage 411 may be optimized differently such as for an LNA driving a mixer with higher input impedance.

In FIG. 4, the input amplifier stage 401 may be configured to include a transistor 404 and a transistor 405 with their drain nodes coupled together. In one example, the transistor 404 may be a PMOS transistor and the transistor 405 may be an NMOS transistor. Such a configuration may provide a high voltage gain for the input amplifier stage 401 while driving a high impedance of the output amplifier stage 411. Further, such configuration may also provide a broadband input impedance match such as fifty ohm (50Ω) using a negative feedback through a match resistor ($R_{match}$) 406. A resistance value of the match resistor ($R_{match}$) 406 may be configured to increase a forward voltage gain ($S_{21}$), decrease a noise figure (NF) or decrease an input port voltage reflection coefficient ($S_{11}$). The input amplifier stage 401 may be self-biased via the transistor 404, the transistor 405, or the match resistor ($R_{match}$) 406. The high voltage gain provided by the input amplifier stage 401 may be converted to a power gain by the output amplifier stage 411, which may also be referred to as a source follower output stage. The input node ($RF_{in}$) 402 may be used to input an electrical signal to the amplifier 400. Further, the input node ($RF_{in}$) 402 may be AC coupled to the input amplifier stage 401 using a first capacitor ($C_c$) 403.

In the current embodiment, the output amplifier stage 411 may be configured to include a transistor 412 such as an NMOS transistor biased using a first resistor ($R_{bias1}$) 413 and a second resistor ($R_{bias2}$) 414. The output of the input amplifier stage 401 may be AC coupled to the input of the output amplifier stage 411 using a second capacitor ($C_{c1}$) 415. The output of the output amplifier stage 411 may be AC coupled to the output node ($RF_{out}$) 417 using a third capacitor ($C_c$) 416. The output amplifier stage 411 may be biased using a biasing circuit 421. The biasing circuit 421 may be configured to include a transistor 424 such as an NMOS transistor and an IIP3 controllable voltage bias ($V_{IIP3}$) node 422. The biasing circuit 421 may also be referred to as a second tuning element 421. The IIP3 controllable voltage bias ($V_{IIP3}$) node 422 may be used to drive a gate of the transistor 424 to provide a bias current to the output amplifier stage 411. A desired OIP3 of the amplifier 400 may be achieved by applying an IIP3 controllable voltage bias ($V_{IIP3}$) at the IIP3 controllable voltage bias ($V_{IIP3}$) node 422 to drive the output amplifier stage 411.

In FIG. 4, a substantial portion of the forward voltage gain ($S_{21}$) or noise figure (NF) may be controlled by the input amplifier stage 401. The input amplifier stage 401 may not affect the OIP3 until, for instance, the current is very small. Thus, the tuning of the forward voltage gain ($S_{21}$) and the noise figure (NF) may be performed using a first tuning element such as a current controller in the input amplifier stage 401. There are various locations to insert one or more current controllers in the input amplifier stage 401. The input amplifier stage 401 may include one of a first current controller ($M_{p1}$) 407, a second current controller ($M_{p2}$) 408, a third current controller ($M_{n2}$) 409, or a fourth current controller ($M_{n1}$) 410, each of which may also be referred to as a first tuning element when combined with a gain controllable voltage bias ($V_{Gain}$) node. The first current controller ($M_{p1}$) 407 and the fourth current controller ($M_{n1}$) 410 may represent PMOS and NMOS tail current sources, respectively. Further, the second current controller ($M_{p2}$) 408 and the third current controller ($M_{n2}$) 409 may be cascaded PMOS and NMOS current sources. The first current controller ($M_{p1}$) 407 may be positioned between a supply voltage and a source node of the transistor 404. The second current controller ($M_{p2}$) 408 may be positioned between a drain node of the transistor 404 and the match resistor ($R_{match}$) 406, the third current controller ($M_{p3}$) 409 and the second capacitor ($C_{c1}$) 415. The third current controller ($M_{P3}$) 409 may be positioned between a drain node of the transistor 405, the match resistor ($R_{match}$) 406 and the second capacitor ($C_{c1}$) 415. The fourth current controller ($M_{p4}$) 410 may be positioned between a source node of the transistor 405 and ground.

Figure 5:
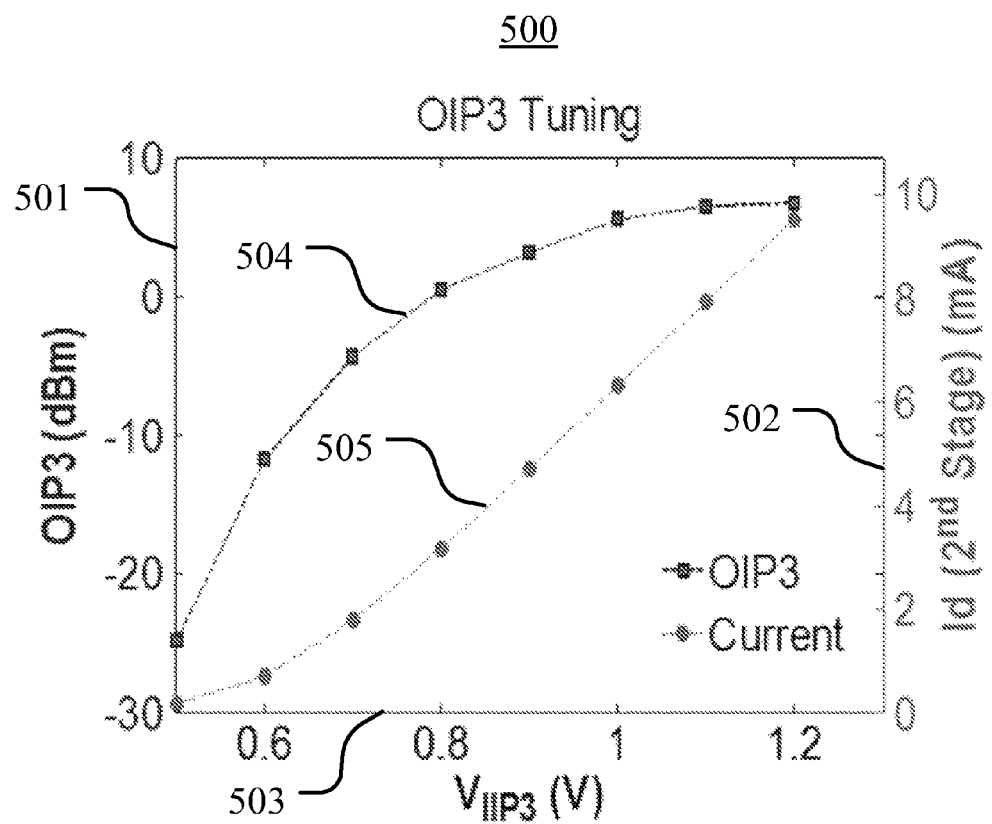
FIG. 5 is a chart having an output third-order intercept point (OIP3) tuning plot of one embodiment of the amplifier of FIG. 4.

FIG. 5 is a chart 500 having an OIP3 tuning plot and a current plot of one embodiment of the amplifier 500 of FIG. 5. The OIP3 tuning plot and the current plot are overlayed on the chart 500. The OIP3 tuning plot includes an OIP3 tuning graph 504 plotted on an ordinate 501 from minus thirty decibels (−30 dB) to ten decibels (10 dB). The current plot includes a current graph 505 plotted on an ordinate 502 from zero milliamps (0 mA) to about eleven milliamps (11 mA). For the OIP3 tuning plot and the current plot, the IIP3 controllable voltage bias ($V_{IIP3}$) from about seven-tenths of a volt (0.7 V) to about one and three-tenths of a volt (1.3 V) is plotted on an abscissa 503. The one embodiment of the amplifier 400 exhibits tunability from about minus twenty-five decibels of the measured power referenced to one milliwatt (−25 dBm) to about five decibels of the measured power referenced to one milliwatt (5 dBm). Further, the one embodiment of the amplifier 400 exhibits a current consumption from about seven-tenths of a milliamp (0.7 mA) to about nine milliamps (9 mA). Also, the forward voltage gain ($S_{21}$) is relatively flat for an IIP3 controllable voltage bias ($V_{IIP3}$) greater than fifty-five hundredths of a volt (0.55 V), as described in FIG. 6.

Figure 6:
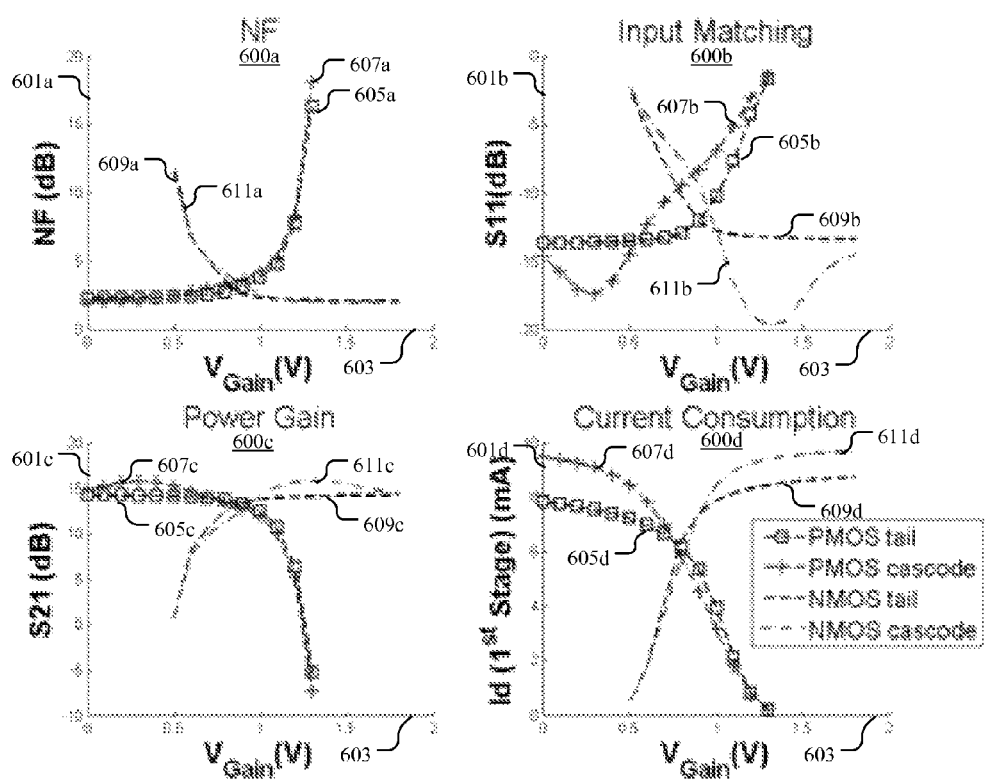
FIG. 6 illustrates a noise figure (NF) plot, a forward voltage gain ($S_{21}$) plot, an input port voltage reflection coefficient ($S_{11}$) plot and a current consumption ($I_d$) of a input amplifier stage of one embodiment of the amplifier of FIG. 4.

FIG. 6 illustrates a noise figure (NF) plot 600a, an input port voltage reflection coefficient ($S_{11}$) plot 600b, a forward voltage gain ($S_{21}$) plot 600c and a current consumption ($I_d$) plot 600d of one embodiment of the amplifier 400 of FIG. 4. Further, the effects of each of the first tuning elements 407 to 410 in the amplifier 400 are evaluated for various performance criteria such as the noise figure (NF), the forward voltage gain ($S_{21}$), the input port voltage reflection coefficient ($S_{11}$) and the current consumption ($I_d$). A gain controllable voltage bias ($V_{Gain}$) is applied to control each of the first tuning elements 407 to 410. For control using either the first current controller ($M_{p1}$,) 407 or the second current controller ($M_{p2}$) 408, the gain controllable voltage bias ($V_{Gain}$) may vary from zero volts (0 V) to one and three-tenths volts (1.3 V). For control using either the third current controller ($M_{n2}$) 409 or the fourth current controller ($M_{n1}$) 410, the gain controllable voltage bias ($V_{Gain}$) may vary from five-tenths volts (0.5 V) to one and eight-tenths volts (1.8V).

Figure 7:
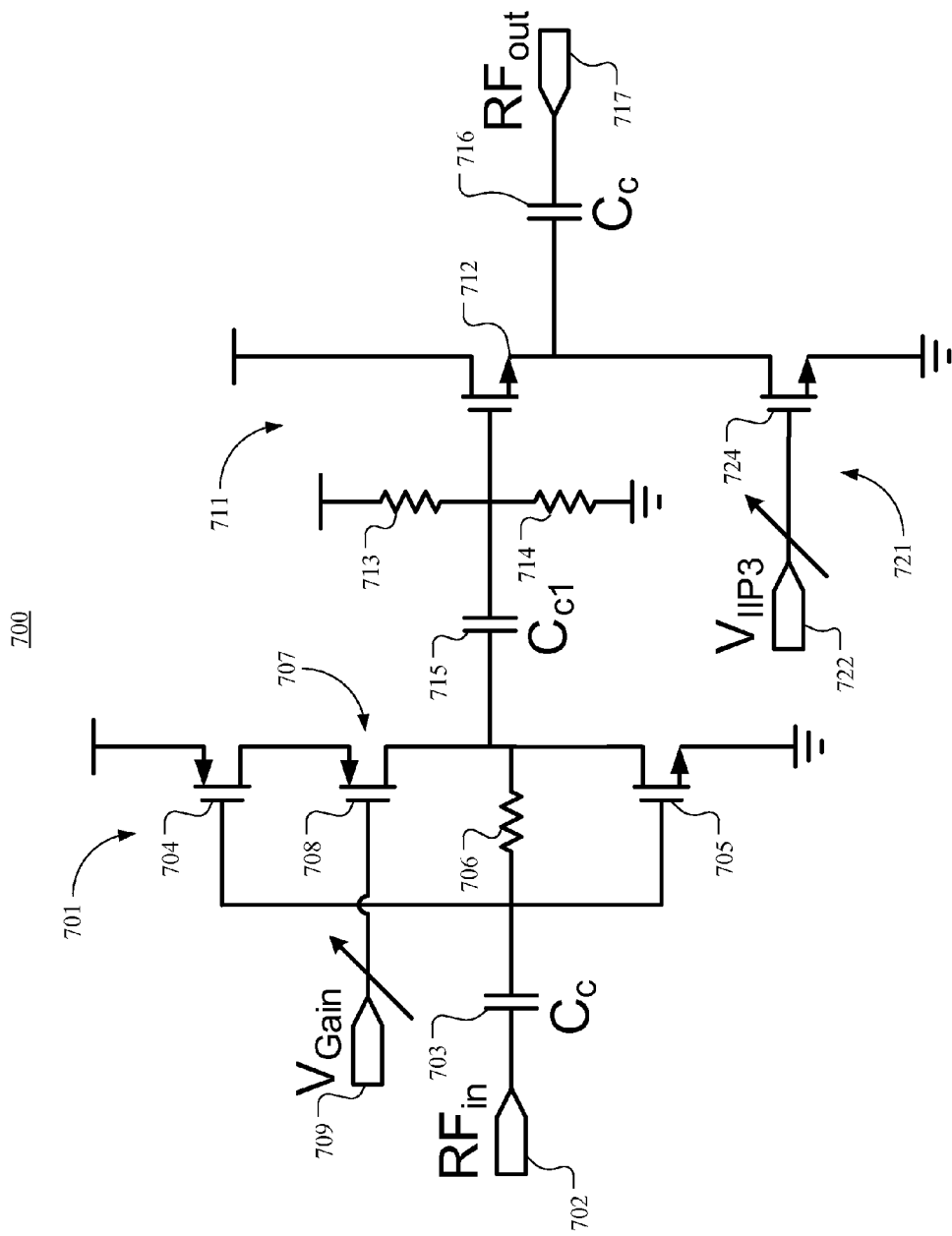
FIG. 7 is a schematic diagram of one embodiment of an amplifier having an orthogonal tuning element with various aspects described herein.

It is important to note that PMOS and NMOS current controllers exhibit maximum current for zero volts (0 V) and one and eight-tenths volts (1.8 V), respectively. In one example, the tail sources of both NMOS and PMOS current controllers may degenerate the transconductance ($g_m$) of the transistor 404 or the transistor 405, resulting in a reduced gain in the high current region. Further, the tail sources of both NMOS and PMOS current controllers may lower the dynamic range of the power versus performance trade-off for the transistor 404 or the transistor 405. The cascaded PMOS and NMOS current controllers may provide improved input return loss ($S_{11}$) or noise figure (NF) for high current, which may make such configurations a better design choice over tail current controllers. Between NMOS and PMOS current controllers, the PMOS cascade current controller exhibits less noise figure (NF) for the same or similar current values. Thus, the PMOS cascade current controller may provide better performance for gain tuning. For example, FIG. 7 is a schematic diagram illustrating one embodiment of an amplifier 700 having orthogonal tuning elements with various aspects described herein. The amplifier 700 may be configured to include an input amplifier stage 701, an output amplifier stage 711, a first tuning element 707 and a second tuning element 721. In one example, the amplifier 700 may be an inductorless RF LNA. The input amplifier stage 701, which may also be referred to as an input stage, may be configured to provide a low input matching impedance such as fifty ohms (50Ω) and a high voltage gain. The output amplifier stage 711 may be configured to provide a high current drive capability into a low load impedance such as fifty ohms (50Ω). Further, the output amplifier stage 711 may be optimized differently such as for an LNA driving a mixer with high input impedance.

In FIG. 7, the input amplifier stage 701 may be configured to include a transistor 704 and a transistor 705 with their drain nodes coupled together. In one example, the transistor 704 may be a PMOS transistor and the transistor 705 may be an NMOS transistor. Such a configuration may provide a high voltage gain for the input amplifier stage 701 while driving a high impedance of the output amplifier stage 711. Further, such configuration may also provide a broadband input impedance match such as fifty ohm (50Ω) using a negative feedback through a match resistor ($R_{match}$) 706. A resistance value of the match resistor ($R_{match}$) 706 may be configured to increase a forward voltage gain ($S_{21}$), decrease a noise figure (NF) or decrease an input return loss ($S_{11}$). The input amplifier stage 701 may be self-biased via the transistor 704, the transistor 705, or the match resistor ($R_{match}$) 706. The high voltage gain provided by the input amplifier stage 701 may be converted to a power gain by the output amplifier stage 711, which may also be referred to as a source follower output stage. The input node ($RF_{in}$) 702 may be used to input an electrical signal to the amplifier 700. Further, the input node ($RF_{in}$) 702 may be AC coupled to the input amplifier stage 701 using a first capacitor ($C_c$) 703.

In the current embodiment, the output amplifier stage 711 may be configured to include a transistor 712 biased using a first resistor ($R_{bias1}$) 713 and a second resistor ($R_{bias2}$) 714, each of which may also be referred to as a high biasing resistor. In one example, the transistor 712 may be an NMOS transistor. The output of the input amplifier stage 701 may be AC coupled to the input of the output amplifier stage 711 using a second capacitor ($C_{c1}$) 715. The output of the output amplifier stage 711 may be AC coupled to the output node ($RF_{out}$) 717 using a third capacitor ($C_c$) 716. The output amplifier stage 711 may be biased using the second tuning element 721. The second tuning element 721 may be configured to include a transistor 724 and an IIP3 controllable voltage bias ($V_{IIP3}$) node 722. The transistor 724 may be coupled to the IIP3 controllable voltage bias ($V_{IIP3}$) node 722. The IIP3 controllable voltage bias ($V_{IIP3}$) node 722 may be used to drive a gate of the transistor 724 to provide a bias current to the output amplifier stage 711. In one example, the transistor 724 may be an NMOS transistor. A desired OIP3 of the amplifier 700 may be achieved by applying the IIP3 controllable voltage bias ($V_{IIP3}$) at the IIP3 controllable voltage bias ($V_{IIP3}$) node 722 to drive the output amplifier stage 711.

In FIG. 7, a substantial portion of the forward voltage gain ($S_{21}$) or noise figure (NF) may be controlled by the input amplifier stage 701. The input amplifier stage 701 may not affect the OIP3 until, for instance, the current is very small. Thus, the tuning of the forward voltage gain ($S_{21}$) or the noise figure (NF) may be performed using the first tuning element 707 in the input amplifier stage 701. The first tuning element 707 may be configured to include a transistor 708 and a gain controllable voltage bias node ($V_{Gain}$) 709. In one example, the transistor 708 may be a PMOS transistor. In another example, the transistor 708 may be a cascaded PMOS current controller. A source node of the transistor 708 may be coupled to a drain node of the transistor 704. Further, a drain node of the transistor 708 may be coupled to the match resistor ($R_{match}$) 706, the second capacitor ($C_{c1}$) 715 and a drain node of the transistor 705. The transistor 708 may be coupled to a gain controllable voltage bias ($V_{Gain}$) node 709. The gain controllable voltage bias ($V_{Gain}$) node 709 may be used to drive a gate of the transistor 709 to provide a bias current to the input amplifier stage 701. A desired forward voltage gain ($S_{21}$) of the amplifier 700 may be achieved by applying a gain controllable voltage bias ($V_{Gain}$) at the gain controllable voltage bias ($V_{Gain}$) node 709.

Figure 8:
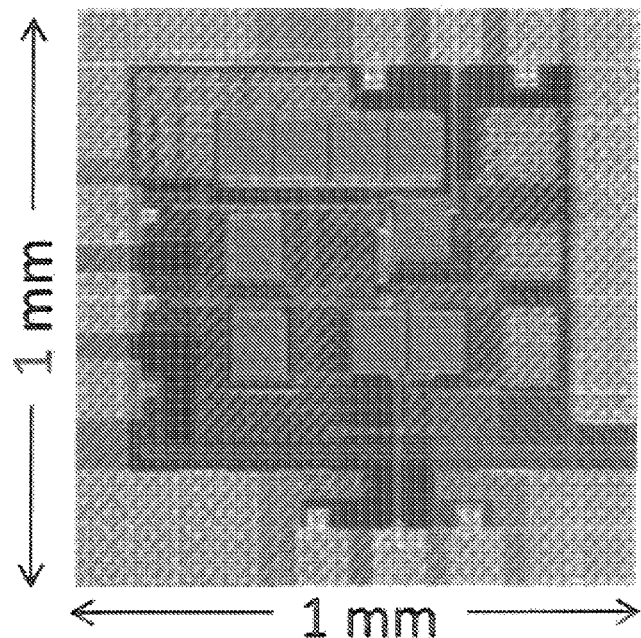
FIG. 8 is a layout and chip micrograph of one embodiment of the amplifier of FIG. 7.
Figure 8:
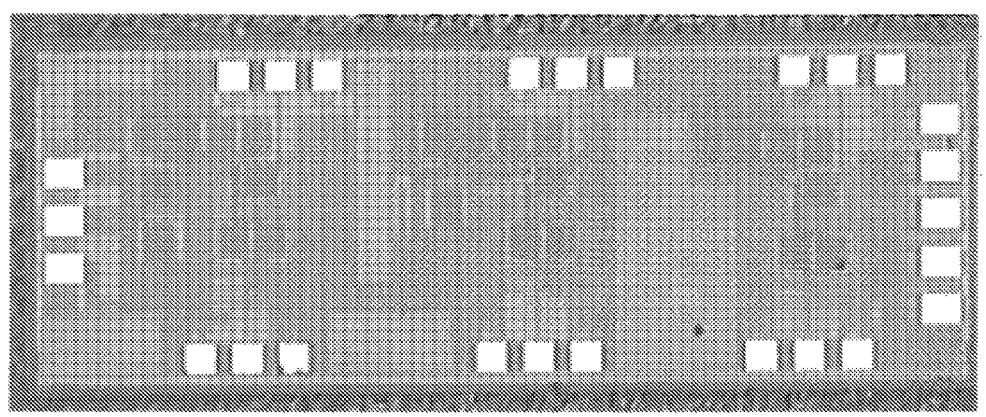

FIG. 8 is a layout 800a and a chip micrograph 800b of one embodiment of the amplifier 700 of FIG. 7. The one embodiment of the amplifier 700 has been implemented using a 0.18μ CMOS fabrication process. The gain controllable voltage bias ($V_{Gain}$) and the IIP3 controllable voltage bias ($V_{IIP3}$) may provide substantially independent or orthogonal control of forward voltage gain ($S_{21}$) and OIP3 to allow for reducing the power consumption of the amplifier 700 while achieving acceptable performance criteria, respectively.

In another embodiment, the gain controllable voltage bias ($V_{Gain}$) or the IIP3 controllable voltage bias ($V_{IIP3}$) may be provided by a processor, controller, central processing unit (CPU), field programmable gate array (FPGA) or the like via a digital-to-analog convertor (DAC). A person of ordinary skill in the art will recognize various designs, configurations and techniques for implementing such method.

Figure 9:
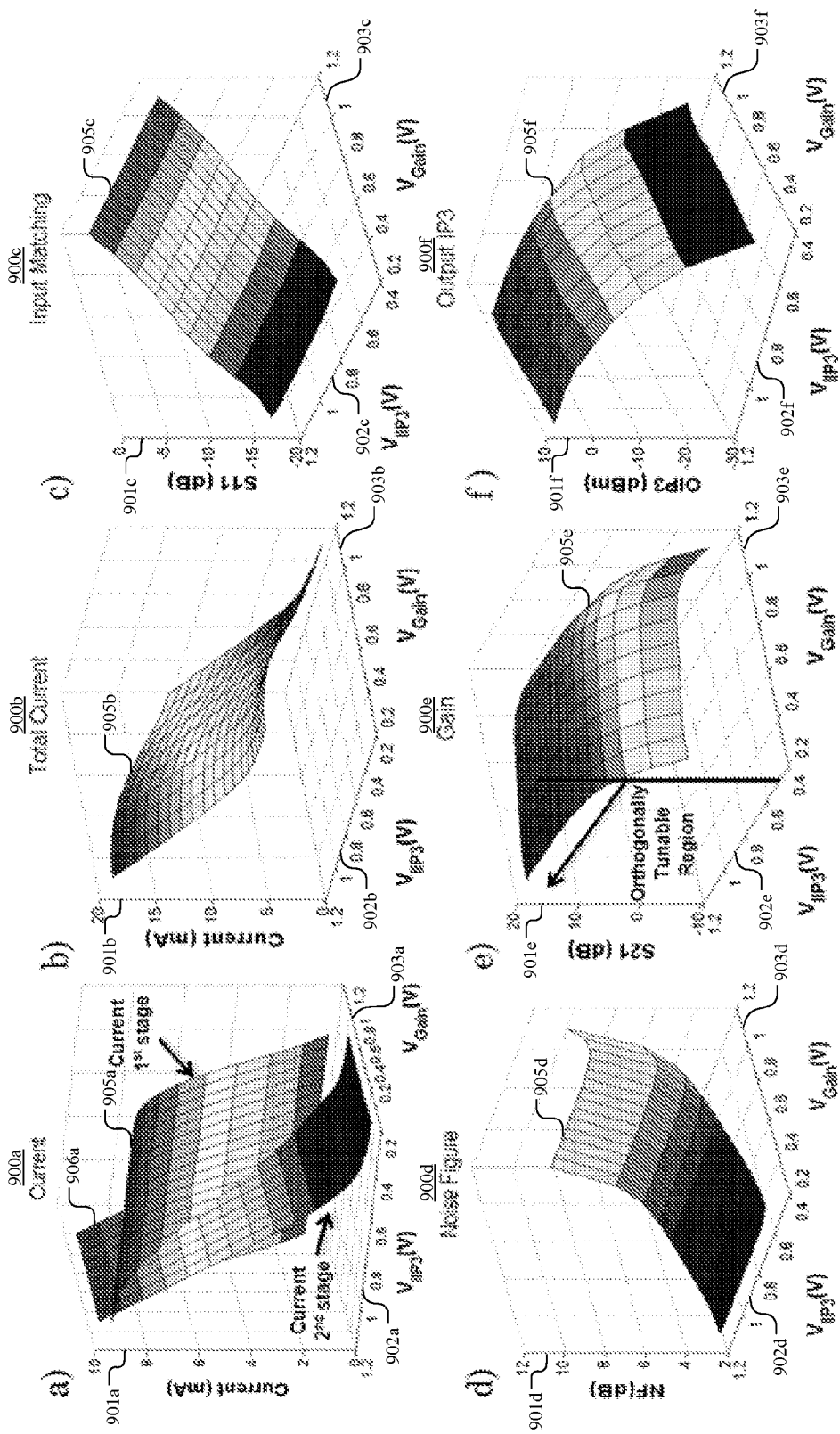
FIG. 9 illustrates an input port voltage reflection coefficient ($S_{11}$) plot, a total current plot, a noise figure (NF) plot, a forward voltage gain ($S_{21}$) plot, and an OIP3 plot of one embodiment of the amplifier of FIG. 7.

FIG. 9 illustrates a current plot 900a, a total current plot 900b, an input port voltage reflection coefficient ($S_{11}$) plot 900c, a noise figure (NF) plot 900d, a forward voltage gain ($S_{21}$) plot 900e, and an OIP3 plot 900f of one embodiment of the amplifier 700 of FIG. 7. The current plot 900a is plotted in three dimensions and includes a first graph 905a of the current used by the first amplifier stage 701 of the amplifier 700 and a second graph 906a of the current used by the second amplifier stage 711 of the amplifier 700. The current is plotted on a y-axis 901a from zero milliamps (0 mA) to ten milliamps (10 mA). The total current plot 900b is plotted in three dimensions and includes a graph 905b of the total current used by the amplifier 700. The total current is plotted on a y-axis 901b from zero milliamps (0 mA) to twenty milliamps (20 mA). The input port voltage reflection coefficient ($S_{11}$) plot 900c is plotted in three dimensions and includes a graph 905c of the input port voltage reflection coefficient ($S_{11}$). The input port voltage reflection coefficient ($S_{11}$) is plotted on the y-axis 901c from minus twenty decibels (−20 dB) to zero decibels (0 dB). The noise figure (NF) plot 900d is plotted in three dimensions and includes a graph 905d of the noise figure (NF). The noise figure (NF) is plotted on the y-axis 901d from two decibels (2 dB) to twelve decibels (12 dB). The forward voltage gain ($S_{21}$) plot 900e is plotted in three dimensions and includes a graph 905e of the forward voltage gain ($S_{21}$). The forward voltage gain ($S_{21}$) is plotted on the y-axis 901e from minus ten decibels (−10 dB) to twenty decibels (20 dB). The OIP3 plot 900f is plotted in three dimensions and includes a graph 905f of the OIP3. The OIP3 is plotted on the y-axis 901f from minus thirty decibels (−30 dB) to ten decibels (10 dB). The IIP3 controllable voltage bias ($V_{IIP3}$) is plotted on the x-axis 902a to 902f from one and two-tenth volts (1.2 V) to two-tenths volts (0.2 V). The gain controllable voltage bias ($V_{Gain}$) is plotted on a z-axis 903a to 903f from two-tenths volts (0.2 V) to one and two-tenths volts (1.2 V).

In FIG. 9, the total current plot 900b shows the total current consumption using both the first tuning element 707 and the second tuning element 721 of the amplifier 700. It may be seen that the total current may be traded off from about eighteen and five-tenths milliamps (18.5 mA) to about seventy-six hundredths milliamps (0.76 mA) in a very gradual manner. The noise figure (NF) plot 900d shows that the noise figure (NF) changes from about six decibels (6 dB) to about eight decibels (8 dB) with gain controllable voltage bias ($V_{Gain}$), whereas the noise figure (NF) remains relatively constant with the IIP3 controllable voltage bias ($V_{IIP3}$). The input port voltage reflection coefficient ($S_{11}$) remains within an acceptable range of less than about minus five decibels (−5 dB) for most of the tuning range of the gain controllable voltage bias ($V_{Gain}$) of less than about one volt (1 V).

The forward voltage gain ($S_{21}$) plot 900e shows the forward voltage gain ($S_{21}$) controllability using the first tuning element 707 and the second tuning element 721 of the amplifier 700. The forward voltage gain ($S_{21}$) exhibits a gradual degradation of about fourteen decibels (14 dB) (17.7 dB to 3.6 dB@$V_{IIP3}$=1.2 V) over the gain controllable voltage bias ($V_{Gain}$). The forward voltage gain ($S_{21}$) shows minor change over the IIP3 controllable voltage bias ($V_{IIP3}$) for an IIP3 controllable voltage bias ($V_{IIP3}$) greater than about fifty-five hundredths volts (0.55 V). For lower voltage values of the IIP3 controllable voltage bias ($V_{IIP3}$), the source follower exhibits a high loss resulting in a reduction of the forward voltage gain ($S_{21}$). However, for the IIP3 controllable voltage bias ($V_{IIP3}$) greater than fifty five-hundredths volts (0.55 V) the amplifier 700 may be substantially independently or orthogonally tuned, as desired. The OIP3 plot 900f shows that OIP3 is relatively constant over the gain controllable voltage bias ($V_{Gain}$), while exhibiting a gradual degradation of about thirty decibels (30 dB) (5 dBm to −25 dBm) over the IIP3 controllable voltage bias ($V_{IIP3}$). Therefore, the amplifier 700 may be substantially independently or orthogonally tuned by using the gain controllable voltage bias ($V_{Gain}$) to achieve about a fourteen decibel (14 dB) gain control range and the IIP3 controllable voltage bias ($V_{IIP3}$) to achieve about a thirty decibel (30 dB) linearity control range. Such substantial independent or orthogonal tunability allows the amplifier 700 to deliver improved performance over various channel conditions or process variations, while reducing power consumption.

Figure 10:
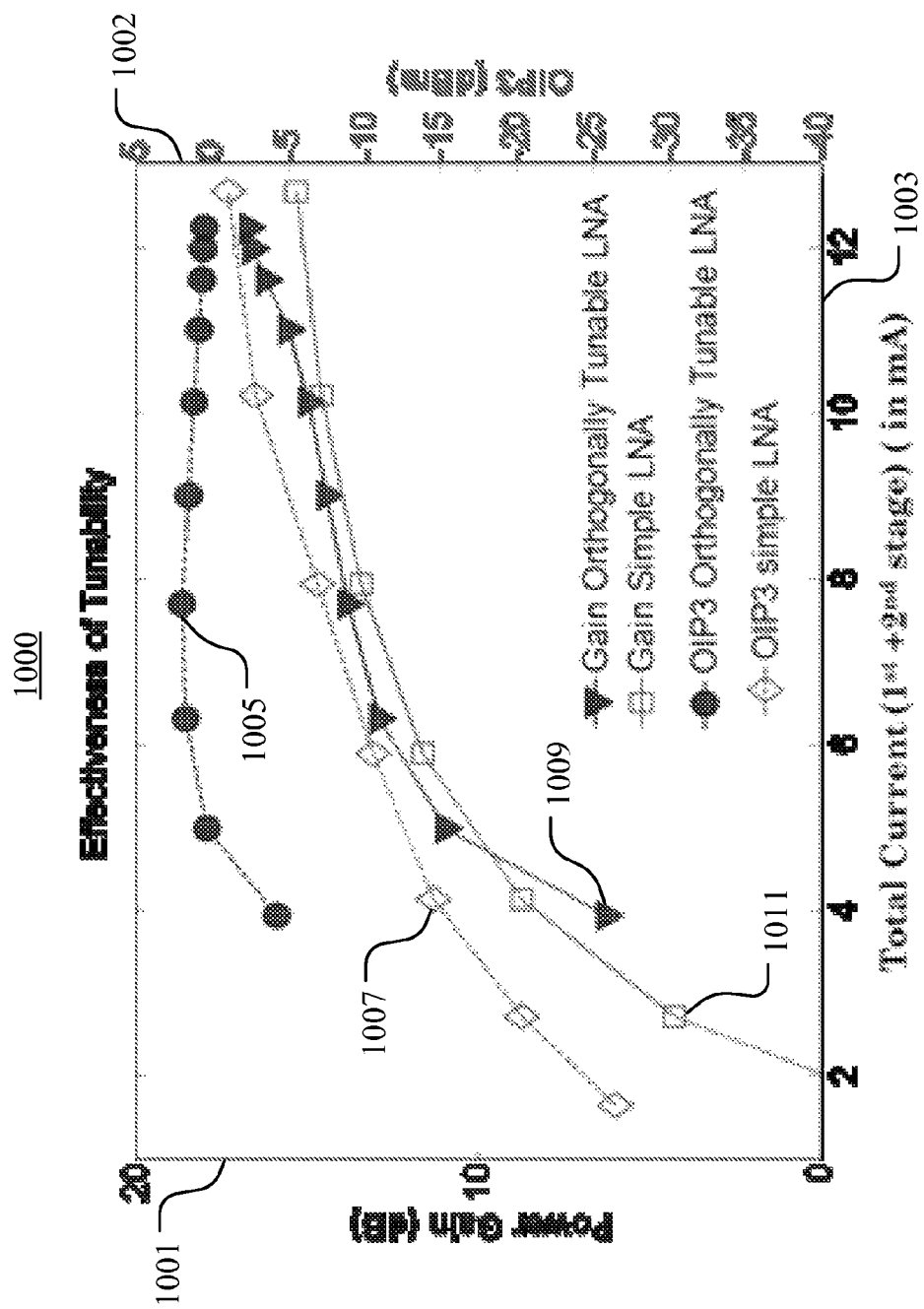
FIG. 10 is a chart illustrating a forward voltage gain ($S_{21}$) plot and an OIP3 plot of one embodiment of the amplifier of FIG. 7 compared to a traditional LNA as their supply voltages are reduced.

FIG. 10 is a chart 1000 illustrating a forward voltage gain ($S_{21}$) plot and an OIP3 plot of one embodiment of the amplifier 700 of FIG. 7 compared to a traditional static LNA as their supply voltages are reduced. The forward voltage gain ($S_{21}$) plot and the OIP3 plot are overlayed on the chart 1000. The OIP3 plot includes a first OIP3 graph 1005 for the amplifier 700 and a second OIP3 graph 1007 for the traditional LNA plotted on an ordinate 1002 from minus forty decibels (−40 dB) to five decibels (5 dB). The forward voltage gain ($S_{21}$) plot includes a first gain graph 1009 for the amplifier 700 and a second gain graph 1011 for the traditional LNA plotted on an ordinate 1001 from zero decibels (0 dB) to twenty decibels (20 dB). For the forward voltage gain ($S_{21}$) plot and the OIP3 plot, the total current from about one milliamp (1 mA) to about thirteen milliamps (13 mA) is plotted on an abscissa 1003. The chart 1000 shows the forward voltage gain ($S_{21}$) and the OIP3 of the amplifier 700 controlled via the gain controllable voltage bias ($V_{Gain}$) achieves similar current consumption. For a scenario where the input signal includes a desired frequency channel with high interferers/blockers with a moderate received signal strength, an amplifier typically requires a low forward voltage gain ($S_{21}$) but high OIP3. The static LNA provides high forward voltage gain ($S_{21}$) and high OIP3, which results in more power consumption. Alternatively, the amplifier 700 may provide relatively constant OIP3 as the forward voltage gain ($S_{21}$) is reduced, resulting in power consumption saving of about seven milliamps (7 mA) (12 mA→5 mA) for the amplifier 700. In addition, a similar power consumption savings may be achieved by an amplifier while self-healing if a process-skewed amplifier has high forward voltage gain ($S_{21}$) but low OIP3 and the amplifier needs to be self-healed for linearity without affecting gain, with minimum power consumption overhead. Healing using a simple LNA would result in increasing both high forward voltage gain ($S_{21}$) and OIP3 leading to higher power consumption.

Throughout the specification and the claims, the following terms take at least the meanings explicitly associated herein, unless the context clearly dictates otherwise. The term "connected" means that one function, feature, structure, or characteristic is directly joined to or in communication with another function, feature, structure, or characteristic. The term "coupled" means that one function, feature, structure, or characteristic is directly or indirectly joined to or in communication with another function, feature, structure, or characteristic. Relational terms such as "first" and "second," and the like may be used solely to distinguish one entity or action from another entity or action without necessarily requiring or implying any actual such relationship or order between such entities or actions. The term "or" is intended to mean an inclusive "or." Further, the terms "a," "an," and "the" are intended to mean one or more unless specified otherwise or clear from the context to be directed to a singular form. The term "include" and its various forms are intended to mean including but not limited to.

In the previous description, numerous specific details are set forth. However, it is to be understood that embodiments of the disclosed technology may be practiced without these specific details. References to "one embodiment," "an embodiment," "example embodiment," "various embodiments," and other like terms indicate that the embodiments of the disclosed technology so described may include a particular function, feature, structure, or characteristic, but not every embodiment necessarily includes the particular function, feature, structure, or characteristic. Further, repeated use of the phrase "in one embodiment" does not necessarily refer to the same embodiment, although it may.

The detailed description is merely illustrative in nature and is not intended to limit the present disclosure, or the application and uses of the present disclosure. Furthermore, there is no intention to be bound by any expressed or implied theory presented in the preceding field of use, background or summary of the disclosure or the following detailed description. The present disclosure provides various examples, embodiments and the like, which may be described herein in terms of functional or logical block elements. Various techniques described herein may be used to design an amplifier having orthogonal tuning elements. The various aspects described herein are presented as methods, devices (or apparatus) or systems that may include a number of components, elements, members, modules, nodes, peripherals, or the like. Further, these methods, devices or systems may include or not include additional components, elements, members, modules, nodes, peripherals, or the like. Furthermore, the various aspects described herein may be implemented using standard programming or engineering techniques to produce software, firmware, hardware, or any combination thereof for an amplifier having orthogonal tuning elements. Of course, a person of ordinary skill in the art will recognize many modifications may be made to this configuration without departing from the scope or spirit of the claimed subject matter.

It is important to recognize that it is impractical to describe every conceivable combination of components or methodologies for purposes of describing the claimed subject matter. However, a person having ordinary skill in the art will recognize that many further combinations and permutations of the subject technology are possible. Accordingly, the claimed subject matter is intended to cover all such alterations, modifications and variations that are within the spirit and scope of the claimed subject matter.

Although the present disclosure describes specific examples, embodiments, and the like, various modifications and changes may be made without departing from the scope of the present disclosure as set forth in the claims below. For example, although the example methods, devices or systems described herein are in conjunction with an amplifier having orthogonal tuning elements, the skilled artisan will readily recognize that the example methods, devices or systems may be used in other methods, devices or systems and may be configured to correspond to such other example methods, devices or systems as needed. Further, while at least one example, embodiment, or the like has been presented in the foregoing detailed description, many variations exist. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all of the claims. Any benefits, advantages, or solutions to problems that are described herein with regard to specific examples, embodiments, or the like are not intended to be construed as a critical, required, or essential feature or element of any or all of the claims.

What is claimed is:

1. An amplifier comprising:
   an input amplifier stage having a first tuning element used to control a first performance criteria of the amplifier and a pair of complementary metal oxide semiconductor (CMOS) transistors;
   an output amplifier stage operatively coupled to the input amplifier stage; and
   a bias circuit operatively coupled to the output amplifier stage and having a second tuning element used to control a second performance criteria of the amplifier;

wherein the first tuning element operates substantially independent of the second tuning element;
wherein the pair of complementary metal oxide semiconductor (CMOS) transistors includes a positive-channel complementary metal oxide semiconductor (PMOS) transistor and a negative-channel complementary metal oxide semiconductor (NMOS) transistor;
wherein a matching resistor is operatively coupled between each gate node and each drain node of the PMOS and NMOS transistors; and
wherein the first tuning element is operatively coupled between the matching resistor and the drain node of the PMOS transistor.

2. The amplifier of claim 1, wherein the first tuning element adjusts a bias current used by the input amplifier stage.

3. The amplifier of claim 1, wherein the second tuning element adjusts a bias current used by the output amplifier stage.

4. The amplifier of claim 1, wherein the first tuning element and the second tuning element are used to adjust the power consumption of the amplifier.

5. The amplifier of claim 1, wherein the first performance criteria is associated with at least one of a forward voltage gain ($S_{21}$) and a noise figure (NF).

6. The amplifier of claim 1, wherein the second performance criteria is an output third-order intercept point (OIP3).

7. The amplifier of claim 1, wherein the first tuning element operates substantially orthogonal to the second tuning element over a first dynamic range associated with the first performance criteria.

8. The amplifier of claim 1, wherein the first tuning element operates substantially orthogonal to the second tuning element over a second dynamic range associated with the second performance criteria.

9. The amplifier of claim 1 further comprising adjusting the first tuning element to reduce a current consumption of the amplifier.

10. The amplifier of claim 1 further comprising adjusting the second tuning element to reduce a current consumption of the amplifier.

11. The amplifier of claim 1, wherein the amplifier is an inductorless radio frequency (RF) low-noise amplifier (LNA).

12. The amplifier of claim 1, wherein the first tuning element is operatively coupled between the complementary metal oxide semiconductor (CMOS) transistors.

13. The amplifier of claim 1, wherein the output amplifier stage includes a negative-channel complementary metal oxide semiconductor (NMOS) transistor, wherein a gate node of the NMOS transistor is coupled to an output of the input amplifier stage.

14. The amplifier of claim 1, wherein the output amplifier stage includes a negative-channel complementary metal oxide semiconductor (NMOS) transistor, wherein a gate node of the NMOS transistor is coupled between a first biasing resistor and a second biasing resistor.

15. An amplifier comprising:
an input amplifier stage having a first tuning element used to control a first performance criteria of the amplifier and a pair of complementary metal oxide semiconductor (CMOS) transistors;
an output amplifier stage operatively coupled to the input amplifier stage; and
a bias circuit operatively coupled to the output amplifier stage and having a second tuning element used to control a second performance criteria of the amplifier;
wherein the first tuning element operates substantially independent of the second tuning element;
wherein the pair of complementary metal oxide semiconductor (CMOS) transistors includes a positive-channel complementary metal oxide semiconductor (PMOS) transistor and a negative-channel complementary metal oxide semiconductor (NMOS) transistor;
wherein a matching resistor is operatively coupled between each gate node and each drain node of the PMOS and NMOS transistors; and
wherein the first tuning element is operatively coupled between the matching resistor and the drain node of the NMOS transistor.

16. An amplifier comprising:
an input amplifier stage having a first tuning element used to control a first performance criteria of the amplifier and a pair of complementary metal oxide semiconductor (CMOS) transistors;
an output amplifier stage operatively coupled to the input amplifier stage; and
a bias circuit operatively coupled to the output amplifier stage and having a second tuning element used to control a second performance criteria of the amplifier;
wherein the first tuning element operates substantially independent of the second tuning element;
wherein the pair of complementary metal oxide semiconductor (CMOS) transistors includes a positive-channel complementary metal oxide semiconductor (PMOS) transistor and a negative-channel complementary metal oxide semiconductor (NMOS) transistor; and
wherein the first tuning element is operatively coupled between a power source and the PMOS transistor.

17. An amplifier comprising:
an input amplifier stage having a first tuning element used to control a first performance criteria of the amplifier and a pair of complementary metal oxide semiconductor (CMOS) transistors;
an output amplifier stage operatively coupled to the input amplifier stage; and
a bias circuit operatively coupled to the output amplifier stage and having a second tuning element used to control a second performance criteria of the amplifier;
wherein the first tuning element operates substantially independent of the second tuning element;
wherein the pair of complementary metal oxide semiconductor (CMOS) transistors includes a positive-channel complementary metal oxide semiconductor (PMOS) transistor and a negative-channel complementary metal oxide semiconductor (NMOS) transistor; and
wherein the first tuning element is operatively coupled between a ground source and the NMOS transistor.

18. An amplifier comprising:
an input amplifier stage having a first tuning element used to control a first performance criteria of the amplifier and a pair of complementary metal oxide semiconductor (CMOS) transistors;
an output amplifier stage operatively coupled to the input amplifier stage; and
a bias circuit operatively coupled to the output amplifier stage and having a second tuning element used to control a second performance criteria of the amplifier;
wherein the first tuning element operates substantially independent of the second tuning element;

wherein each gate node of the complementary metal oxide semiconductor (CMOS) transistors is operatively coupled to an input node.

\* \* \* \* \*